United States Patent
Chung et al.

(10) Patent No.: US 10,629,644 B1
(45) Date of Patent: Apr. 21, 2020

(54) IMAGE SENSOR AND METHOD OF MANUFACTURING THE SAME

(71) Applicant: Powerchip Technology Corporation, Hsinchu (TW)

(72) Inventors: Chih-Ping Chung, Hsinchu (TW); Ming-Yu Ho, Taichung (TW); Wen-Hao Huang, Hsinchu (TW); Saysamone Pittikoun, Hsinchu County (TW)

(73) Assignee: Powerchip Technology Corporation, Hsinchu (TW)

( * ) Notice: Subject to any disclaimer, the term of this patent is extended or adjusted under 35 U.S.C. 154(b) by 33 days.

(21) Appl. No.: 16/194,399

(22) Filed: Nov. 19, 2018

(30) Foreign Application Priority Data

Oct. 1, 2018 (TW) .............................. 107134628 A

(51) Int. Cl.
| | |
|---|---|
| *H01L 27/146* | (2006.01) |
| *H04N 5/359* | (2011.01) |
| *H04N 5/355* | (2011.01) |
| *H04N 5/3745* | (2011.01) |

(52) U.S. Cl.
CPC .. *H01L 27/14643* (2013.01); *H01L 27/14609* (2013.01); *H01L 27/14623* (2013.01); *H01L 27/14641* (2013.01); *H04N 5/359* (2013.01); *H04N 5/3559* (2013.01); *H04N 5/37452* (2013.01)

(58) Field of Classification Search
CPC ......... H01L 27/14643; H01L 27/14623; H01L 27/14641; H01L 27/14609; H04N 5/37452; H04N 5/3559; H04N 5/359
See application file for complete search history.

(56) References Cited

U.S. PATENT DOCUMENTS

| | | | |
|---|---|---|---|
| 8,153,947 | B2 | 4/2012 | Barbier et al. |
| 8,773,562 | B1 * | 7/2014 | Fan .................... H01L 27/14634 348/308 |
| 8,895,349 | B2 | 11/2014 | Chuang et al. |
| 9,159,751 | B2 * | 10/2015 | Lee .................... H01L 27/14605 |

(Continued)

FOREIGN PATENT DOCUMENTS

KR 100776152 11/2007

OTHER PUBLICATIONS

"Office Action of Taiwan Counterpart Application," dated Oct. 16, 2019, p. 1-p. 5.

*Primary Examiner* — Seung C Sohn
(74) *Attorney, Agent, or Firm* — JCIPRNET

(57) ABSTRACT

An image sensor includes a semiconductor substrate, a photodiode formed in the semiconductor substrate, a microlens disposed over the photodiode, a first transfer transistor, a second transfer transistor and a capacitor. The first transfer transistor and the second transfer transistor are formed on the semiconductor substrate, and a memory node is formed in the semiconductor substrate between the first transfer transistor and the second transfer transistor, wherein the first transfer transistor is coupled to the photodiode. The capacitor is formed between the first transfer transistor and the second transfer transistor, and the capacitor includes a first electrode coupled to the memory node, a second electrode on the first electrode and extending to an edge of the photodiode, and a dielectric layer between the first and the second electrodes.

15 Claims, 6 Drawing Sheets

(56) References Cited

U.S. PATENT DOCUMENTS

| | | |
|---|---|---|
| 2007/0040922 A1 | 2/2007 | McKee et al. |
| 2009/0201400 A1 | 8/2009 | Zhang et al. |
| 2016/0286151 A1 | 9/2016 | Lahav et al. |
| 2017/0280080 A1 | 9/2017 | Machida et al. |

* cited by examiner

IMAGE SENSOR AND METHOD OF MANUFACTURING THE SAME

CROSS-REFERENCE TO RELATED APPLICATION

This application claims the priority benefit of Taiwan application serial no. 107134628, filed on Oct. 1, 2018. The entirety of the above-mentioned patent application is hereby incorporated by reference herein and made a part of this specification.

BACKGROUND

Technical Field

The present invention is related to an image sensor technique, and especially to an image sensor and a method of manufacturing the same.

Description of Related Art

As products such as digital cameras and electronic scanners are developed continuously, the demand for image sensor devices is accordingly increased in the market. At present, the commonly used image sensor devices are divided into charge coupled devices (CCD) and complementary metal-oxide-semiconductor image sensors (CMOS image sensor or CIS). Among them, the CMOS image sensor devices have the advantages of low operation voltage, low power consumption and high operation efficiency, random access according to needs, and are suitable for mass production because they can be integrated into the existing semiconductor technique. Therefore, the CMOS image sensors can be broadly applied to various application fields.

Moreover, in order to avoid distortion of the image of a high-speed moving object, a global shutter (GS) image sensor has been developed, in which each pixel of the entire pixel array acquires an image in the same period. Therefore, in-pixel memory cells are required to store signals after extracted by the photodiode. Besides, in order to further improve the performance of the global shutter image sensor, a capacitor is usually arranged to increase the storage capacitance.

However, the capacitor usually occupies more than half of the area in the image sensor, resulting in a relatively smaller area of the photodiode. On the other hand, if the area of the capacitor is reduced, poor image reading is obtained.

SUMMARY

The present invention provides an image sensor capable of reducing parasitic light sensitivity and increasing fill factor.

The present invention further provides a method of manufacturing an image sensor, by which the image sensor is manufactured with low parasitic light sensitivity and high fill factor.

The present invention provides an image sensor that includes a semiconductor substrate, a photodiode formed in the semiconductor substrate, a microlens disposed over the photodiode, a first transfer transistor, a second transfer transistor and a capacitor. The first transfer transistor and the second transfer transistor are formed on the semiconductor substrate, and a memory node (MN) is formed in the semiconductor substrate between the first transfer transistor and the second transfer transistor, wherein the first transfer transistor is coupled to the photodiode. The capacitor is formed between the first transfer transistor and the second transfer transistor, and the capacitor includes a first electrode coupled to the memory node, a second electrode on the first electrode and extending to an edge of the photodiode, and a dielectric layer between the first and the second electrodes.

According to an embodiment of the present invention, the dielectric layer further extends between the edge of the photodiode and the second electrode.

According to an embodiment of the present invention, a material of the first electrode includes polysilicon or metal, and a material of the second electrode is metal.

According to an embodiment of the present invention, the image sensor further includes an inter-layer dielectric (ILD) layer formed on the semiconductor substrate and a conductive plug formed in the inter-layer dielectric layer. The inter-layer dielectric layer covers the first transfer transistor, the second transfer transistor and the memory node. The conductive plug is electrically coupled to the memory node and the first electrode located on the inter-layer dielectric layer.

According to an embodiment of the present invention, the conductive plug is a polysilicon plug.

According to an embodiment of the present invention, a sidewall of the inter-layer dielectric layer is located at the edge of the photodiode and exposes a portion of the photodiode.

According to an embodiment of the present invention, the inter-layer dielectric layer further extends and covers the photodiode and has a trench, and the trench is located between the first transfer transistor and the photodiode and exposes the edge of the photodiode.

According to an embodiment of the present invention, the dielectric layer further extends between a surface of the trench and the second electrode.

According to an embodiment of the present invention, the image sensor further includes an overflow (OF) transistor disposed on the semiconductor substrate beside the photodiode and coupled to the photodiode.

According to an embodiment of the present invention, the dielectric layer has a thickness of about 500 Å or lower.

The present invention further provides a method of manufacturing an image sensor that includes the following steps. A semiconductor substrate is provided. The semiconductor substrate has a photodiode and a memory node formed therein. The semiconductor substrate has a second transfer transistor and a first transfer transistor formed thereon. The first transfer transistor is coupled to the photodiode, and the memory node is located between the first transfer transistor and the second transfer transistor. A capacitor is formed between the first transfer transistor and the second transfer transistor. The capacitor includes a first electrode coupled to the memory node, a dielectric layer formed on the first electrode, and a second electrode formed on the dielectric layer and extending to an edge of the photodiode. A microlens is formed over the photodiode.

According to another embodiment of the present invention, before forming of the capacitor, the method further includes the following steps. An inter-layer dielectric layer is formed on the semiconductor substrate and covers the first transfer transistor, the second transfer transistor and the memory node. A conductive plug is formed in the inter-layer dielectric layer and in contact with the memory node.

According to another embodiment of the present invention, steps of forming the capacitor include the following steps. A conductive layer is formed on the inter-layer dielectric layer and electrically coupled to the memory node via the conductive plug. A portion of the conductive layer and a portion of the inter-layer dielectric layer are removed, so as to expose a portion of the photodiode and form the first electrode, wherein a sidewall of the inter-layer dielectric layer is located at the edge of the photodiode. The dielectric layer is formed on the first electrode and on the sidewall of the inter-layer dielectric layer. The second electrode is formed on the dielectric layer.

According to another embodiment of the present invention, the dielectric layer further extends to the edge of the photodiode.

According to another embodiment of the present invention, steps of forming the capacitor include the following steps. A conductive layer is formed on the inter-layer dielectric layer and electrically coupled to the memory node via the conductive plug. A portion of the conductive layer is removed to form the first electrode. A portion of the inter-layer dielectric layer is removed to form a trench in the inter-layer dielectric layer between the first transfer transistor and the photodiode, and the trench exposes the edge of the photodiode. The dielectric layer is formed on the first electrode and on a surface of the trench. The second electrode is formed on the dielectric layer.

Based on the above, the specific capacitor structure design in the present invention can increase the capacitance value by reducing the thickness of the dielectric layer, and thereby reduce the area of the capacitor while increase the area of the photodiode, and thus, the fill factor of the image sensor is greatly increased. Moreover, the upper electrode (second electrode) of the capacitor not only functions as an electrode but also provides the light shield (LS) effect so as to reduce the parasitic light sensitivity of the image sensor. In addition, if the lower electrode of the capacitor is polysilicon and coupled to the memory node through a polysilicon plug, the dark current can be reduced by such a homogenous contact interface.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
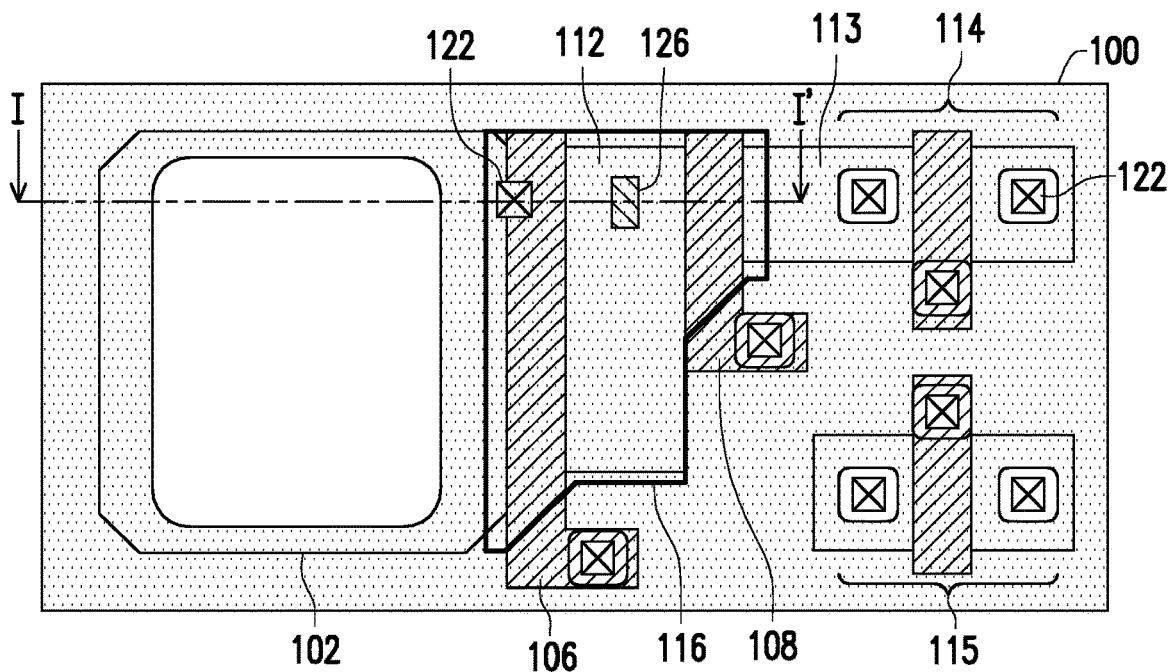
FIG. 1A is a schematic top view of an image sensor in accordance with a first embodiment of the present invention.

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals. Besides, the terms such as "contain", "include", and "have" used in the specification are to be construed as open-ended terms (i.e., meaning "including, but not limited to,") unless otherwise noted. In addition, directional terms used in the specification such as "on," "above," "under," and "below" are only directions used in the figures. Therefore, the directional terms are used to illustrate and are not intended to limit the invention.

Figure 1B:
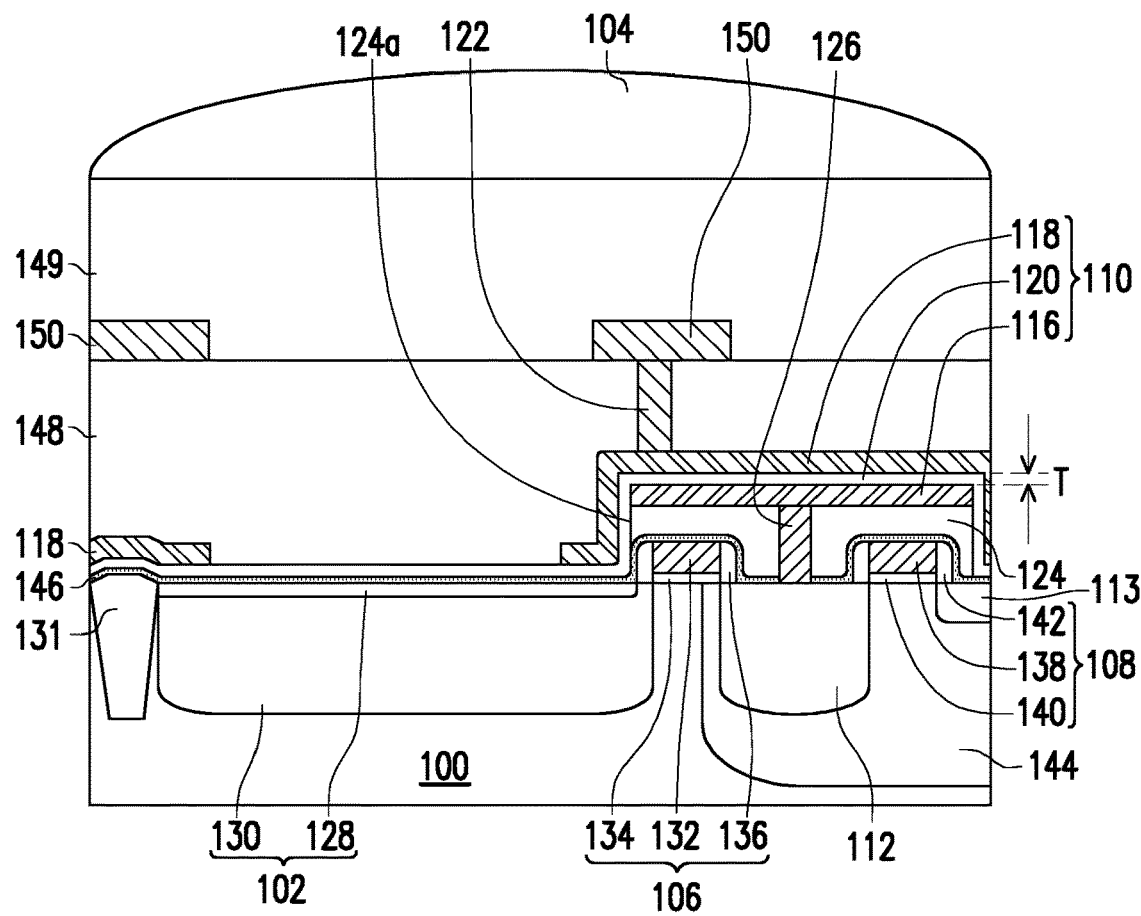
FIG. 1B is a schematic cross-sectional view of the image sensor taken along the line I-I' of FIG. 1A.

FIG. 1A is a schematic top view of an image sensor in accordance with a first embodiment of the present invention. FIG. 1B is a schematic cross-sectional view of the image sensor taken along the line I-I' of FIG. 1A.

Referring to FIG. 1A and FIG. 1B, the image sensor of the present embodiment basically includes a semiconductor substrate 100, a photodiode 102 formed in the semiconductor substrate 100, a microlens 104 disposed over the photodiode 102, a first transfer transistor 106 and a second transfer transistor 108. For the sake of clarity, the microlens 104 is omitted in FIG. 1A. In an image sensor such as a global shutter image sensor, multiple pixels (as shown in FIG. 1A) in each row can be simultaneously exposed and then unexposed at the same time, so the first transfer transistor 106 needs to simultaneously transfer the photo-charges accumulated in the photodiode 102 to the memory node 112. Since the signals formed by the photo-charges must be read row by row or read in a selective manner, a large capacitance is required to memorize and store the charges at the memory node 112. Therefore, the image sensor suppresses distortion of the image of a high-speed moving object. In addition, the second transfer transistor 108 is configured to transfer the above charges from the memory node 112 to a floating diffusion node 113 row by row or in a selective manner. The residual charges after the previous image reading operation are usually erased via a reset transistor 114 before every time the photo-charges are transferred to the floating diffusion node 113. Furthermore, the floating diffusion node 113 is usually connected to the gate of the source follower (SF) 115 to couple and output the charges from the floating diffusion node 113. The capacitor 110 is formed between the first transfer transistor 106 and the second transfer transistor 108, and includes a first electrode 116, a second electrode 118 and a dielectric layer 120 between the first and second electrodes 116 and 118. The first electrode 116 is coupled to the memory node 112, the second electrode 118 is located on the first electrode 116 and extends to an edge of the photodiode 102 to achieve the light shielding (LS) effect, thereby reducing the parasitic light sensitivity of the image sensor. The light shielding range of the second electrode 118 (i.e., the portion covered by the "dots" as shown in FIG. 1A) includes all the transistors (e.g., the first transfer transistor 106, the second transfer transistor 108, the reset transistor 114, the source follower (SF) 115, etc.) on the semiconductor substrate 100 and respective doped diffusion regions in the semiconductor substrate 100, and only exposes a portion of the photodiode 102 and a position where the contact 122 is intended to be formed, but the present invention is not limited thereto. The light shielding range of the second electrode 118 may only include the edge of the photodiode 102, the memory node 112, the first transfer transistor 106, the second transfer transistor 108, and the reset transistor 114. The light shielding range of the second electrode 118 may only include the edge of the photodiode 102 and the memory node 112. In this embodiment, the material of the first electrode 116 may be polysilicon or metal, and the material of the second electrode 118 is, for example, a reflective conductor or metal such as tungsten.

Continue referring to FIG. 1B, the image sensor may further include an inter-layer dielectric layer 124 formed on the semiconductor substrate 100 and a conductive plug 126 formed on the memory node 112. The inter-layer dielectric layer 124 covers the first transfer transistor 106, the second transfer transistor 108 and the memory node 112, and the conductive plug 126 is configured to electrically connect the memory node 112 and the first electrode 116 in the inter-layer dielectric layer 124. When the material of the first electrode 116 is polysilicon, a polysilicon plug used as the conductive plug 126 can be simultaneously formed as when the first electrode 116 is formed. Thus, the conductive plug 126 of polysilicon and the memory node 112 form a homogenous contact interface therebetween, thereby reducing the dark current. In addition, the sidewall 124a of the inter-layer dielectric layer 124 is located at the edge of the photodiode 102 and exposes a portion of the photodiode 102, so that the second electrode 118 of the capacitor 110 can self-align and extend to the edge of the photodiode 102 to enhance the sidewall shielding effect. In this case, the dielectric layer 120 may extend between the edge of the photodiode 102 and the second electrode 118. The material of the above dielectric layer 120 includes, for example but not limited to, any material having a high dielectric constant, such as silicon oxide, silicon nitride or silicon oxynitride; or a high-k oxide such as zirconium oxide ($ZrO_2$), tantalum oxide ($Ta_2O_5$), aluminum oxide ($Al_2O_3$), titanium oxide ($TiO_2$), hafnium oxide ($HfO_2$), lanthanum oxide ($La_2O_3$) or the like; or a high-k oxygenated metal compound such as barium titanate ($BaTiO_3$), barium titanate ($SrTiO_3$) or the like. Since the thickness T of the dielectric layer 120 of the capacitor 110 is thin, for example, about 500 Å or lower, the capacitance value can be relatively increased. As compared with the area of a conventional image sensor in which the dielectric layer of the metal-insulator-metal capacitor (MIM capacitor) is about 2000 Å thick, the area of the capacitor 110 of the invention can be greatly reduced, so that the area of the photodiode 102 can be relatively increased, and the fill factor of the image sensor is accordingly increased.

Further, in the present embodiment, the semiconductor substrate 100 is, for example, a silicon substrate, an epitaxial silicon substrate, a silicon germanium substrate, a silicon carbide substrate, or a silicon-on-insulator (SOI) substrate. The photodiode 102 is a device capable of converting a light signal into an electrical signal, such as a PN type photodiode, a PNP type photodiode, an NP type photodiode, an NPN type photodiode or the like. For example, the photodiode 102 of the present embodiment is a PNP type photodiode composed of a p+ region 128, an n-type region 130 and a P-type epitaxial silicon substrate (i.e., semiconductor substrate 100), as shown in FIG. 1B, and the forming method thereof includes, for example, implanting a P-type dopant and an N-type dopant into the semiconductor substrate 100 using ion implant processes, so that the p+ region 128 is formed on the n-type region 130, but the present invention is not limited thereto. Moreover, isolation structures 131 are disposed in the semiconductor substrate 100 for isolating different devices. Although FIG. 1B shows only one isolation structure 131, it should be understood that multiple isolation structures are actually provided on peripheries of doped diffusion regions in the entire semiconductor substrate 100. The first transfer transistor 106 generally has a first transfer transistor gate 132, a gate oxide layer 134 and a spacer 136, and the second transfer transistor 108 generally has a second transfer transistor gate 138, a gate oxide layer 140 and a spacer 142. The first transfer transistor 106 is coupled to the photodiode 102 and the memory node 112, the second transfer transistor 108 is coupled the memory node 112 to the floating diffusion region node 113. The first transfer transistor 106 transfers the photo-charges generated in the photodiode 102 to the memory node 112, the second transfer transistor 108 then transfers the charges in the memory node 112 to the floating diffusion area and is coupled to the gate of the source follower 115 for signal output, and the reset transistor 114 erases the residual charges after the previous image reading operation. The memory node 112 is located in the semiconductor substrate 100 and may be an N-type diffusion region surrounded by a p-type well 144. Further, due to the process, a silicon nitride layer as an etch stop layer 146 is provided on the surfaces of the semiconductor substrate 100, the first transfer transistor 106 and the second transfer transistor 108, but the present invention is not limited thereto. An inter-layer dielectric layer 148, at least one inter-metal dielectric layer 149 and a circuit layer 150 are usually provided between the microlens 104 and the capacitor 110 for wire connection. For example, the second electrode 118 can be connected to the circuit layer 150 via the contact plug 122, and then connected to the external circuit.

Figure 2:
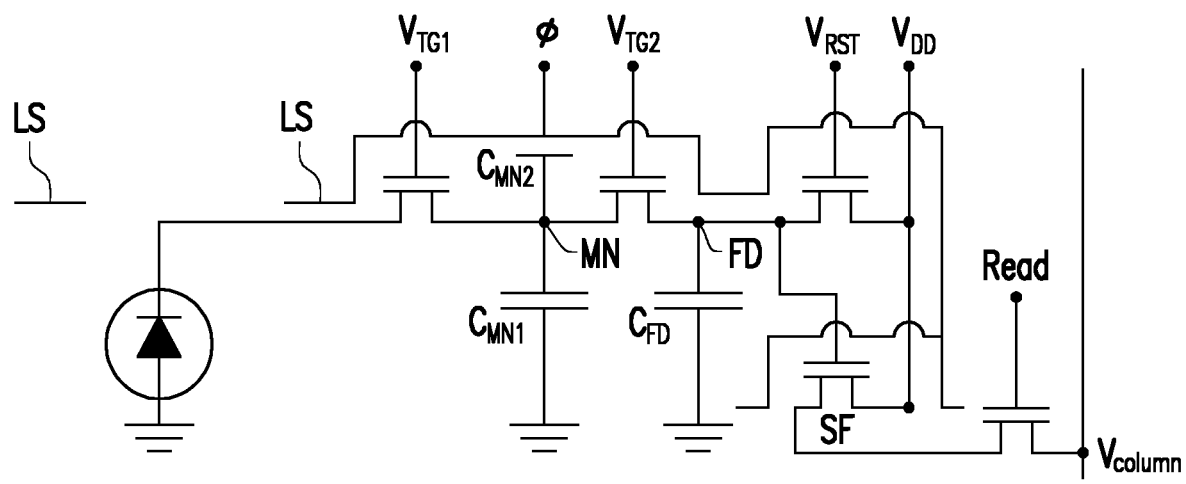
FIG. 2 is a circuit diagram of the image sensor of FIG. 1A.

FIG. 2 is a circuit diagram of the image sensor of FIG. 1A. In FIG. 2, the first terminal of the first transfer transistor is coupled to the photodiode, the second terminal of the first transfer transistor is coupled to the memory node MN, and the control terminal of the first transfer transistor receives a first transfer transistor gate voltage $V_{TG1}$. The first terminal of the second transfer transistor is coupled to the memory node MN, the second terminal of the second transfer transistor is coupled to the first terminal of the reset transistor, the floating diffusion region node FD and the gate terminal of the source follower SF, and the control terminal of the second transfer transistor receives a second transfer transistor gate voltage $V_{TG2}$. The first terminal of the reset transistor is coupled to the second terminal of the second transfer transistor, the floating diffusion region node FD and the gate terminal of the source follower SF, the second terminal is coupled to a supply voltage $V_{DD}$, and the control terminal of the reset transistor receives a reset transistor gate voltage $V_{RST}$. The capacitor between the second transfer transistor and the first transfer transistor is composed of a capacitor $C_{MN1}$ below the memory node MN and a capacitor $C_{MN2}$ above the memory node MN connected in parallel, and the upper electrode (second electrode) of $C_{MN2}$ is connected to a specific voltage ϕ (for example, 0 volt). After the exposure, the image signals (photo-charges) will be stored at the memory node MN of the capacitors $C_{MN1}$ and $C_{MN2}$ via the first transfer transistor, the image signals (photo-charges) are transferred to the capacitor $C_{FD}$ of the floating diffusion region node FD row by row or selectively, and are outputted to the reading circuit (Read) through the source follower SF. Then, the residual charges of the memory node MN and the floating diffusion region node FD are erased via the reset transistor before each reading operation. The upper electrode (such as the second electrode 118 of FIG. 1A) of the capacitor $C_{MN2}$ of the memory node MN of this embodiment extends and covers the edge of the photodiode and most of the image sensor, and therefore, in FIG. 2, the extension range of the upper electrode of the capacitor $C_{MN2}$ of the memory node MN is indicated by symbol LS.

Figure 3:
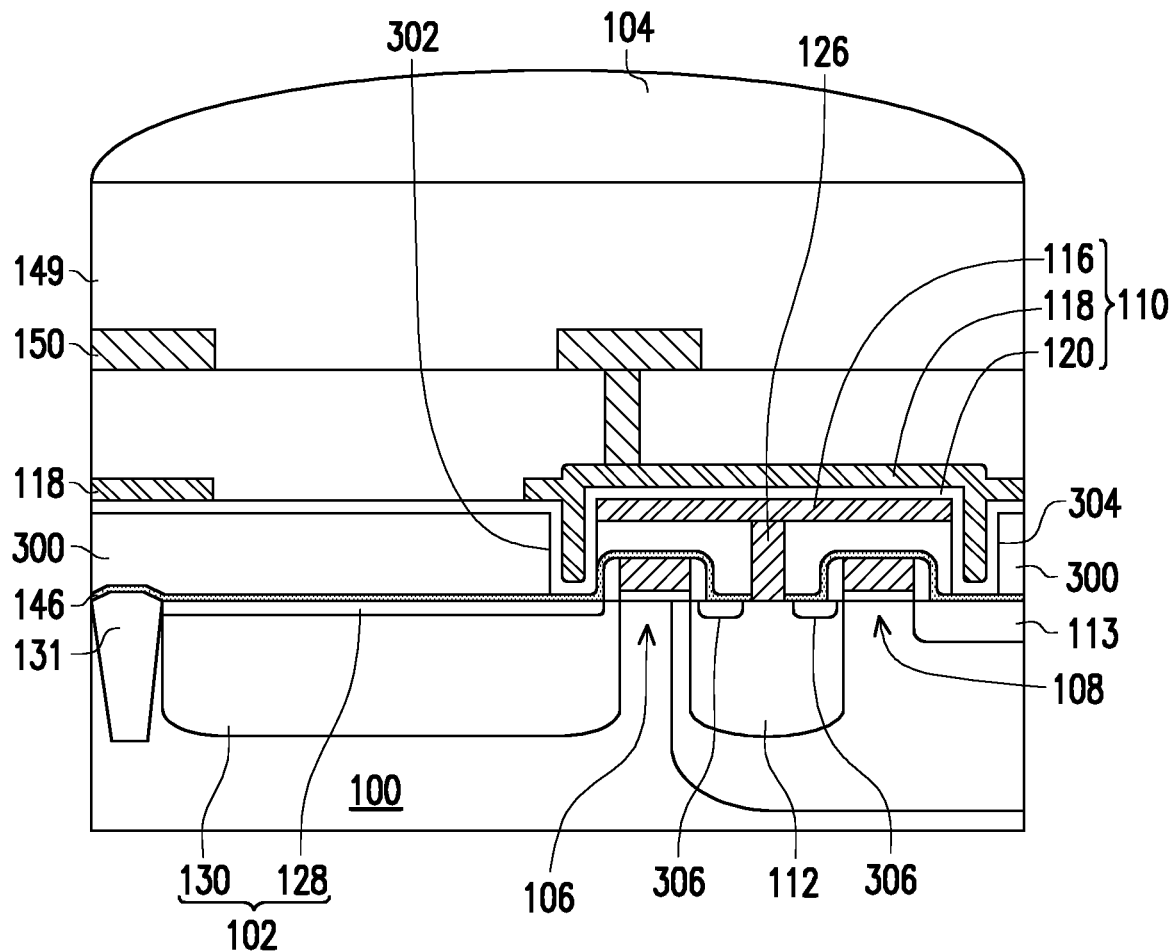
FIG. 3 is a schematic cross-sectional view of an image sensor in accordance with a second embodiment of the present invention.

FIG. 3 is a schematic cross-sectional view of an image sensor in accordance with a second embodiment of the present invention, in which the reference numerals of the first embodiment is used to denote the same or similar components of this embodiment, so the descriptions of those components can be referred to the first embodiment, and the details are not iterated herein.

Referring to FIG. 3, the image sensor of the present embodiment basically includes a semiconductor substrate 100, a photodiode 102 formed in the semiconductor substrate 100, a microlens 104 disposed over the photodiode 102, a first transfer transistor 106, a second transfer transistor 108 and a capacitor. 110, the difference between the image sensor of this embodiment and the image sensor of the first embodiment lies in that, the inter-layer dielectric layer 300 covers the first transfer transistor 106, the second transfer transistor 108 and the memory node 112, and extends to cover the photodiode 102. Moreover, the inter-layer dielectric layer 300 has a trench 302 located between the first transfer transistor 106 and the photodiode 102 and exposing the edge of the photodiode 102. Further, the trench 304 may also be present in the inter-layer dielectric layer 300 of the second transfer transistor 108 relative to the floating diffusion node 113. Therefore, the first electrode 116 of the capacitor 110 is also coupled to the memory node 112, the second electrode 118 is located on the first electrode 116 and extends to the edge of the photodiode 102, the dielectric layer 120 is between the first electrode 116 and the second electrode 118 and extends between the surfaces of the trenches 302 and 304 and the second electrode 118. In this embodiment, the inter-layer dielectric layer 300 fully covers the surface of the semiconductor substrate 100 (and the overlying components). In addition, heavily doped diffusion regions 306 having a conductivity type different from that of the memory node 112 may be disposed in the memory node 112, and the heavily doped diffusion regions 306 are located near surfaces of the first transfer transistor 106 and the second transfer transistor 108. For example, the memory node 112 is an N-type diffusion region, and the heavily doped diffusion regions 306 are p+ regions.

Figure 4A:
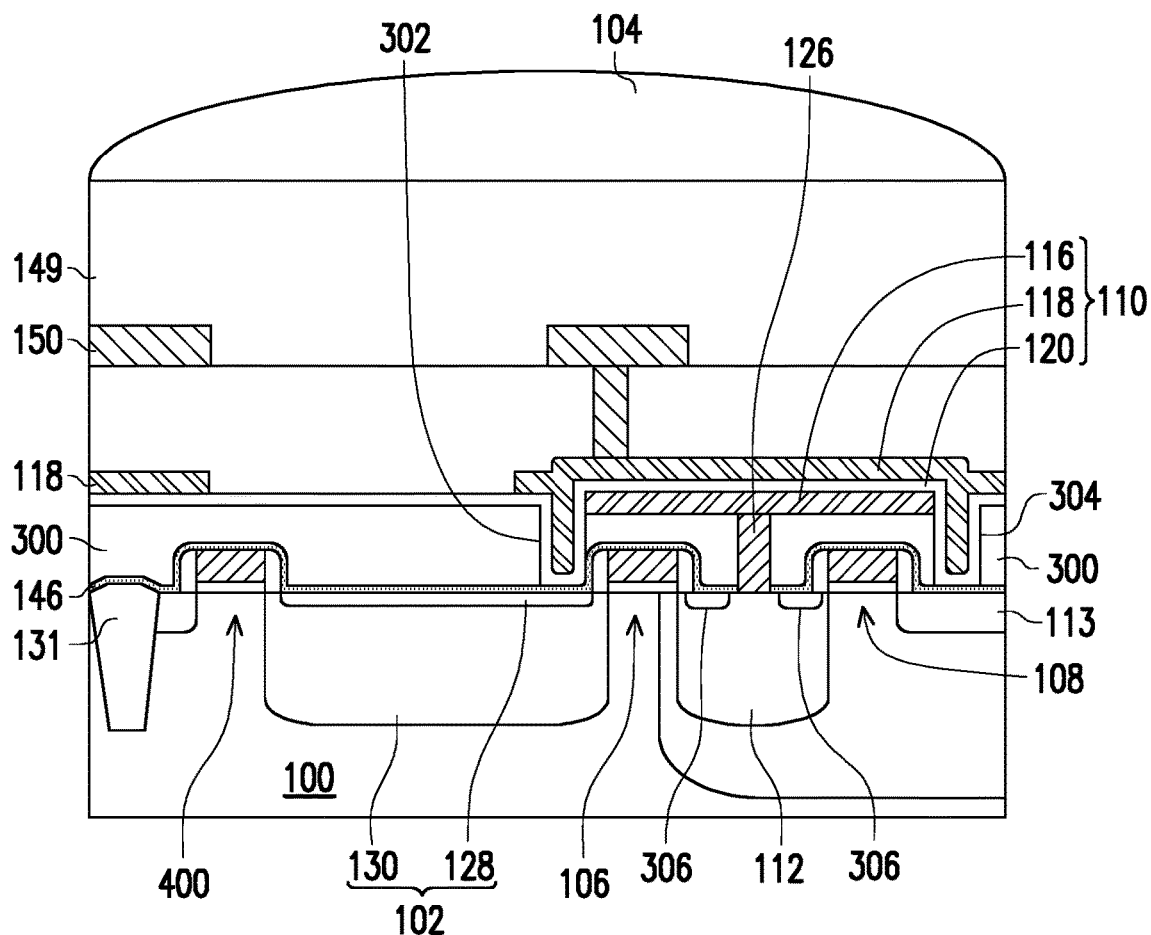
FIG. 4A is a schematic cross-sectional view of an image sensor in accordance with a third embodiment of the present invention.

FIG. 4A is a schematic cross-sectional view of an image sensor in accordance with a third embodiment of the present invention, in which the reference numerals of the second embodiment are used to indicate the same or similar components of this embodiment, so the descriptions of those components can be referred to the second embodiment, and the details are not iterated herein.

Referring to FIG. 4A, the difference between the image sensor of this embodiment and the image sensor of the second embodiment lies in that, an overflow transistor 400 is further disposed on the semiconductor substrate 100 next to the photodiode 102. Usually, the overflow transistor 400 is adjacent to the photodiode 102 to erase the residual charges within the photodiode 102, or to suppress the blooming effect in which charge saturation and diffusion to the adjacent pixels due to the high illumination.

Figure 4B:
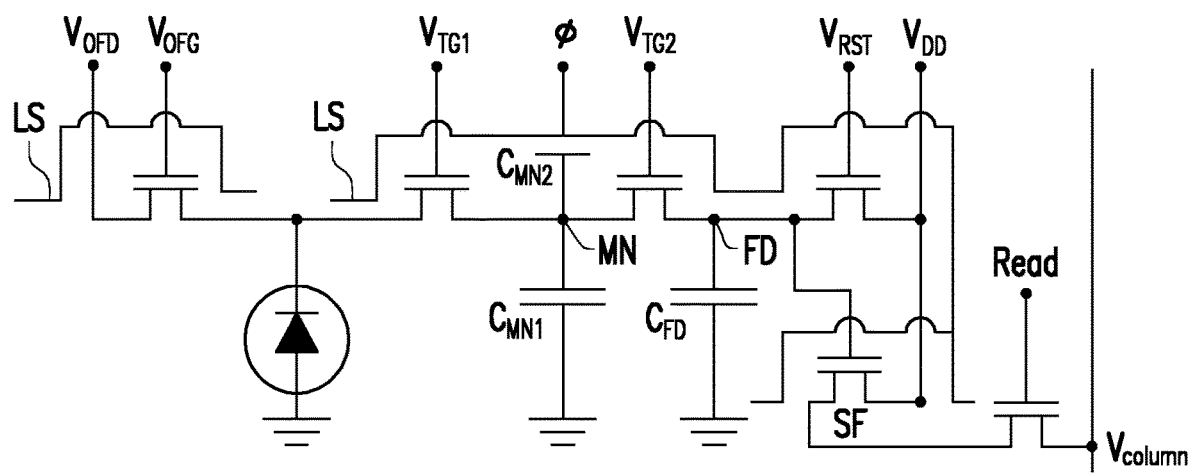
FIG. 4B is a circuit diagram of the image sensor of FIG. 4A.

FIG. 4B is a circuit diagram of the image sensor of FIG. 4A, in which the reference numerals of FIG. 2 are used to indicate the same or similar components of this embodiment, so the descriptions of those components can be referred to those described in FIG. 2, and the details are not iterated herein.

In FIG. 4B, the first terminal of the overflow transistor is coupled to an overflow transistor node voltage $V_{OFD}$, the second terminal of the overflow transistor is coupled to the photodiode, and the control terminal is coupled to a gate voltage $V_{OFG}$ of the overflow transistor.

FIG. 5A to FIG. 5E are schematic cross-sectional views of a method of manufacturing an image sensor in accordance with a fourth embodiment of the present invention.

Figure 5A:
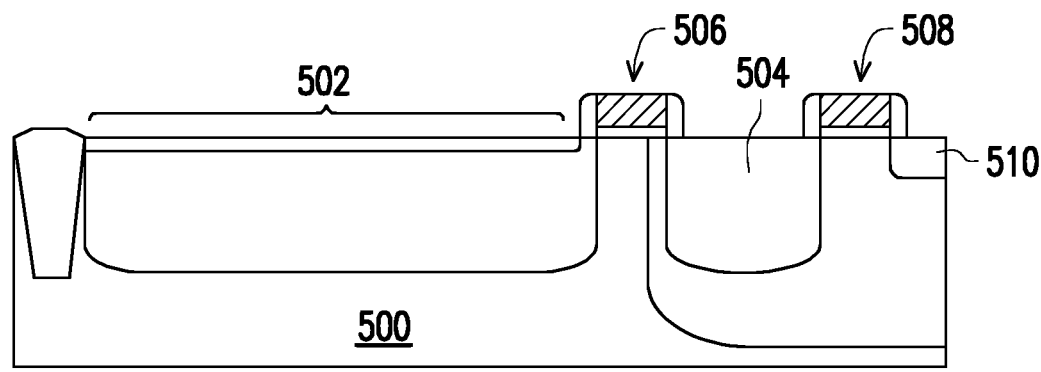
FIG. 5A to FIG. 5E are schematic cross-sectional views of a method of manufacturing an image sensor in accordance with a fourth embodiment of the present invention.

Referring to FIG. 5A, in the present embodiment, a semiconductor substrate 500 is provided. The semiconductor substrate 500 has a photodiode 502 and a memory node (MN) 504 formed therein, and has a first transfer transistor 506 and a second transfer transistor 508 formed thereon. The second transfer transistor 508 is coupled to the photodiode 502. The memory node 504 is located between the first transfer transistor 506 and the second transfer transistor 508. In addition, the semiconductor substrate 500 also has a floating diffusion region node 510 coupled to the second transfer transistor 508. The photodiode 502, the memory node 504, the first transfer transistor 506 and the second transfer transistor 508 can be manufactured using the existing technique, and therefore, the details are not iterated herein.

Figure 5B:
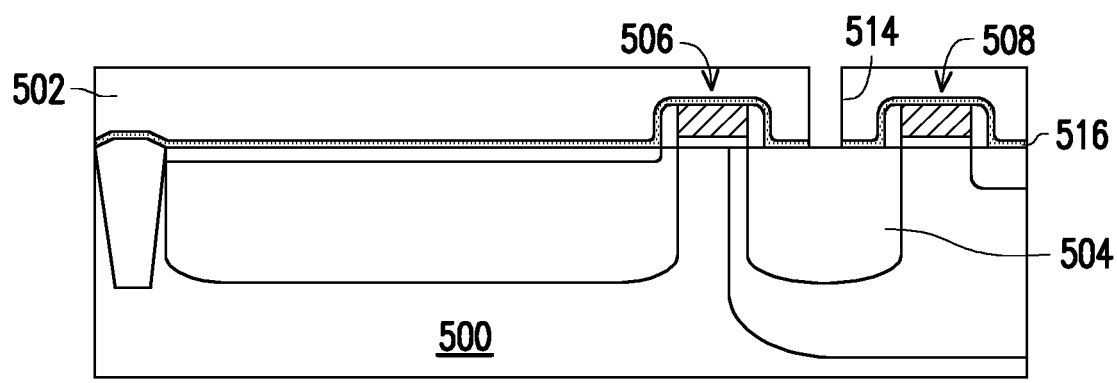

Referring to FIG. 5B, in order to form a capacitor between the first transfer transistor 506 and the second transfer transistor 508, an inter-layer dielectric layer 512 is formed on the semiconductor substrate 500 covering the first transfer transistor 506, the second transfer transistor 508 and the memory node 504, and an opening 514 is formed in the inter-layer dielectric layer 512 and exposes the memory node 504. Moreover, upon the process requirements, a silicon nitride layer may be formed on the semiconductor substrate 500 before the formation of the inter-layer dielectric layer 512, and the silicon nitride layer functions as an etch stop layer 516 for the subsequent processes.

Figure 5C:
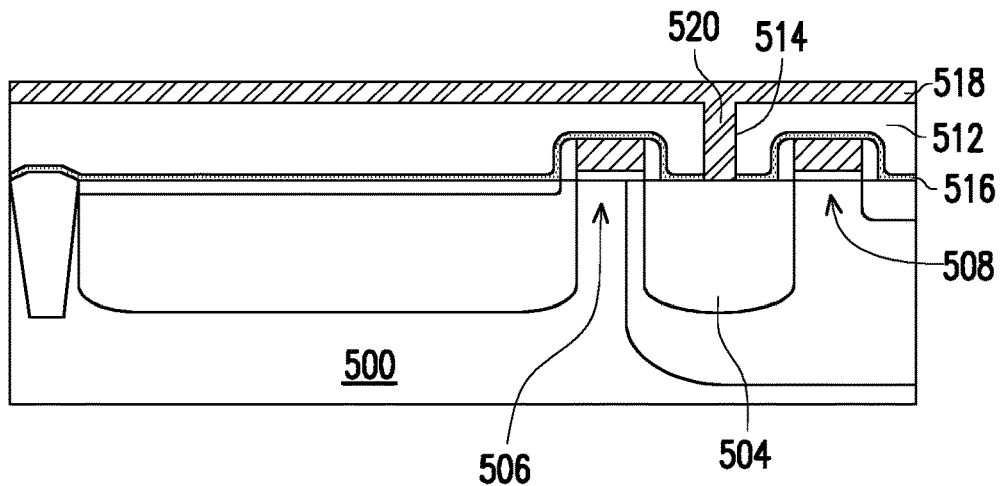

Referring to FIG. 5C, a conductive layer 518 is formed on the inter-layer dielectric layer 512, and completely fills the opening 514 to form a conductive plug 520. Since the conductive layer 518 as the first electrode and the conductive plug 520 are formed by the same deposition process, the conductive layer 518 and the conductive plug 520 are made by the same material. However, the present invention is not limited thereto. In another embodiment, a conductive plug 520 may be formed in the opening 514 in the inter-layer dielectric layer 512, and a conductive layer 518 in contact with the conductive plug 520 may be additionally disposed on the inter-layer dielectric layer 512, so the conductive layer 518 and the conductive plug 520 can made by different materials.

Figure 5D:
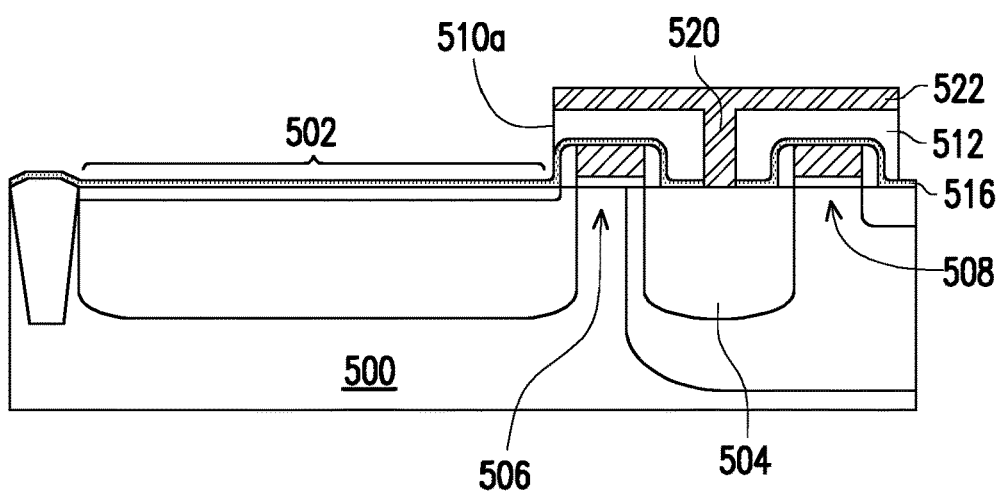

Referring to FIG. 5D, a portion of the conductive layer (518 of FIG. 5C) and a portion of the inter-layer dielectric layer 512 are removed, so as to expose a portion of the photodiode 502 and form a first electrode 522, and the sidewall 512a of the inter-layer dielectric layer 512 is located at the edge of the photodiode 502. The partial removal of the conductive layer (518 of FIG. 5C) and the inter-layer dielectric layer 512 can be performed by utilizing the same photomask for lithography etching processes and by using the etch stop layer 516 as an etch stop layer during the etching of the inter-layer dielectric layer 512. Therefore, the first electrode 522 and the inter-layer dielectric layer 512 have the same shape on the layout.

Figure 5E:
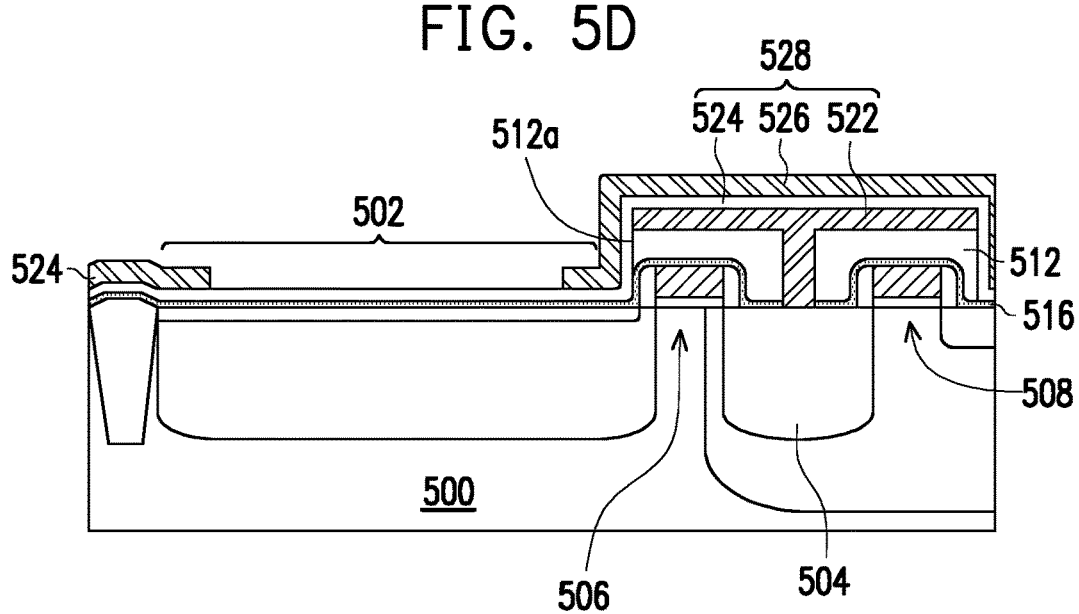

Referring to FIG. 5E, a dielectric layer 524 is formed on the first electrode 522 and on the sidewall 512a of the inter-layer dielectric layer 512, and a second electrode 526 is formed on the dielectric layer 524 to complete the fabrication of the capacitor 528. Because the sidewall 512a of the inter-layer dielectric layer 512 is located at the edge of the photodiode 502 and exposes a portion of the photodiode 502, the second electrode 526 of the capacitor 528 can self-align and extend to the edge of the photodiode 502. The dielectric layer 524 can also extend to the edge of the photodiode 502.

After forming the capacitor 528, an interconnect process can be subsequently performed, and a microlens is formed over the photodiode to obtain an image sensor similar to that of FIG. 1B.

Figure 6A:
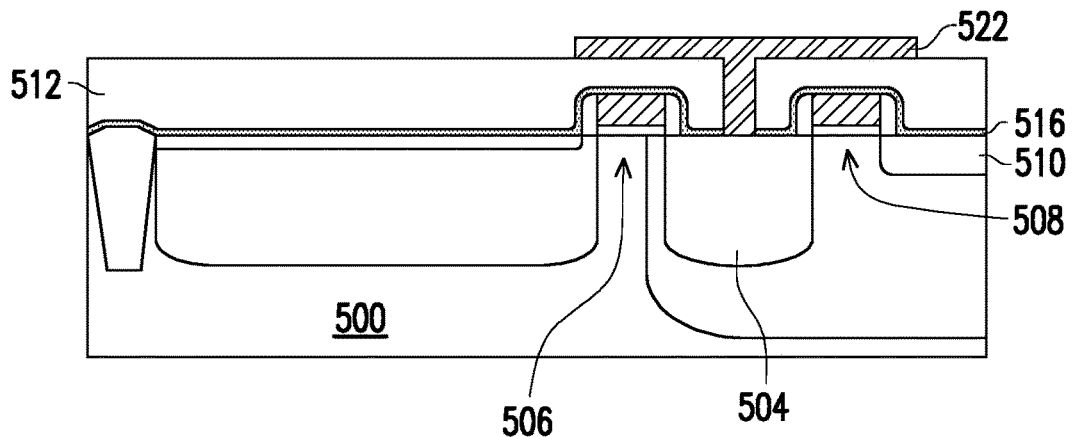
FIG. 6A to FIG. 6C are schematic cross-sectional views of a method of manufacturing an image sensor in accordance with a fifth embodiment of the present invention.
Figure 6B:
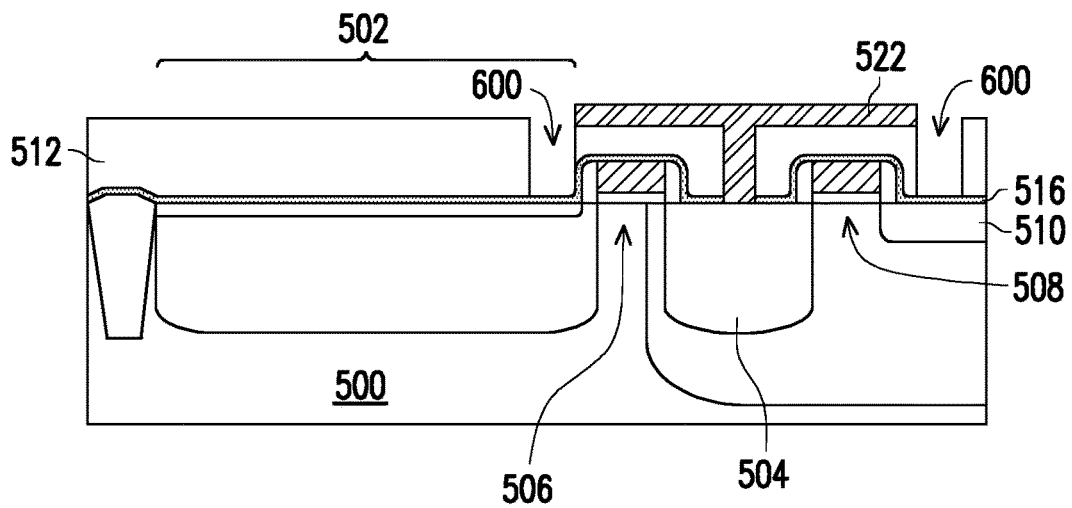
Figure 6C:
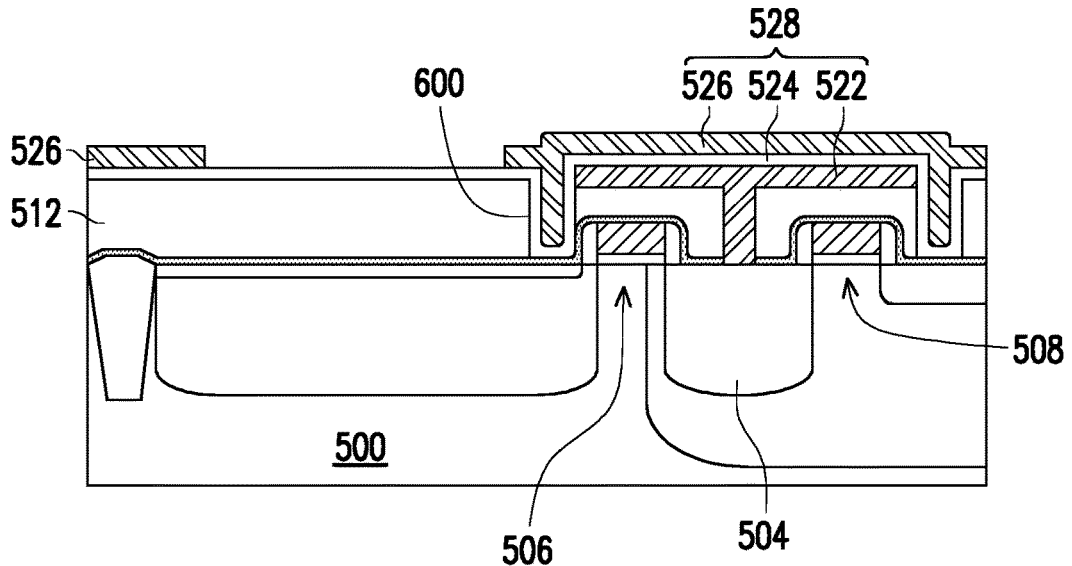

FIG. 6A to FIG. 6C are schematic cross-sectional views of a method of manufacturing an image sensor in accordance with a fifth embodiment of the present invention, in which the reference numerals of the fourth embodiment are used to indicate the same or similar components of this embodiment, so the descriptions of forming methods can be referred to those of the fourth embodiment, and the details are not iterated herein.

The manufacturing method of image sensor of the fifth embodiment can be first referred to those described in FIG. 5A to FIG. 5C, and a portion of the conductive layer is then removed to form a first electrode 522, as shown in FIG. 6A.

Referring to FIG. 6B, a portion of the inter-layer dielectric layer 512 is removed to form a trench 600 in the inter-layer dielectric layer 512 between the first transfer transistor 506 and the photodiode 502, and the trench 600 exposes the edge of the photodiode 502. In this embodiment, the inter-layer dielectric layer 512 completely covers the surface of the semiconductor substrate 500 (and the overlying components), so the formation of the trench 600 conforms to the extension criteria. The method of removing the portion of the inter-layer dielectric layer 512 includes using the etch stop layer 516 as an etch stop layer during the etching of the inter-layer dielectric layer 512.

Referring to FIG. 6C, a dielectric layer 524 is formed on the first electrode 522 and on the surface of the trench 600, and a second electrode 526 is formed on the dielectric layer 524 to complete the fabrication of the capacitor 528.

After forming the capacitor 528, an interconnection process can be subsequently performed, and a microlens is formed over the photodiode to obtain an image sensor similar to that of FIG. 3.

In summary, the image sensor of the present invention is an image sensor equipped with a capacitor having a thin dielectric layer, thereby increasing the capacitance value, reducing the area of the capacitor, increasing the area of the photodiode, and accordingly increasing the fill factor of the image sensor. Moreover, the upper electrode of the capacitor can also provide a shielding effect, which reduces the parasitic light sensitivity of the image sensor.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An image sensor, comprising:
    a semiconductor substrate;
    a photodiode, formed in the semiconductor substrate;
    a microlens, disposed over the photodiode;
    a first transfer transistor, formed on the semiconductor substrate and coupled to the photodiode;
    a second transfer transistor, formed on the semiconductor substrate, wherein a memory node is formed in the semiconductor substrate between the first transfer transistor and the second transfer transistor; and
    a capacitor, formed between the first transfer transistor and the second transfer transistor and comprising:
        a first electrode, coupled to the memory node;
        a second electrode, disposed on the first electrode and extending to an edge of the photodiode; and
        a dielectric layer, disposed between the first electrode and the second electrode.

2. The image sensor of claim 1, wherein the dielectric layer further extends between the edge of the photodiode and the second electrode.

3. The image sensor of claim 1, wherein a material of the first electrode comprises polysilicon or metal, and a material of the second electrode is metal.

4. The image sensor of claim 3, further includes:
    an inter-layer dielectric layer, formed on the semiconductor substrate, covering the first transfer transistor, the second transfer transistor and the memory node; and
    a conductive plug, formed in the inter-layer dielectric layer, the conductive plug being electrically coupled to the memory node and the first electrode located on the inter-layer dielectric layer.

5. The image sensor of claim 4, wherein the conductive plug is a polysilicon plug.

6. The image sensor of claim 4, wherein a sidewall of the inter-layer dielectric layer is located at the edge of the photodiode and exposes a portion of the photodiode.

7. The image sensor of claim 4, wherein the inter-layer dielectric layer further extends and covers the photodiode and has a trench, and the trench is located between the first transfer transistor and the photodiode and exposes the edge of the photodiode.

8. The image sensor of claim 7, wherein the dielectric layer further extends between a surface of the trench and the second electrode.

9. The image sensor of claim 1, further comprising an overflow transistor disposed on the semiconductor substrate beside the photodiode and coupled to the photodiode.

10. The image sensor of claim 1, wherein the dielectric layer has a thickness of 500 Å or lower.

11. A method of manufacturing an image sensor, comprising:
    providing a semiconductor substrate, wherein the semiconductor substrate has a photodiode and a memory node formed therein, the semiconductor substrate has a second transfer transistor and a first transfer transistor formed thereon, the first transfer transistor is coupled to the photodiode, and the memory node is located between the first transfer transistor and the second transfer transistor;
    forming a capacitor between the first transfer transistor and the second transfer transistor, wherein the capacitor comprises a first electrode coupled to the memory node, a dielectric layer formed on the first electrode, and a second electrode formed on the dielectric layer and extending to an edge of the photodiode; and
    forming a microlens over the photodiode.

12. The method of claim 11, further comprising, before forming of the capacitor:
    forming an inter-layer dielectric layer on the semiconductor substrate, the inter-layer dielectric layer covering the first transfer transistor, the second transfer transistor and the memory node; and forming a conductive plug in the inter-layer dielectric layer, the conductive plug being in contact with the memory node.

13. The method of claim 12, wherein steps of forming the capacitor comprise:

forming a conductive layer on the inter-layer dielectric layer, the conductive layer being electrically coupled to the memory node via the conductive plug;

removing a portion of the conductive layer and a portion of the inter-layer dielectric layer, so as to expose a portion of the photodiode and form the first electrode, wherein a sidewall of the inter-layer dielectric layer is located at the edge of the photodiode;

forming the dielectric layer on the first electrode and on the sidewall of the inter-layer dielectric layer; and forming the second electrode on the dielectric layer.

14. The method of claim 13, wherein the dielectric layer further extends to the edge of the photodiode.

15. The method of claim 12, wherein steps of forming the capacitor comprise:

forming a conductive layer on the inter-layer dielectric layer, the conductive layer being electrically coupled to the memory node via the conductive plug;

removing a portion of the conductive layer to form the first electrode;

removing a portion of the inter-layer dielectric layer to form a trench in the inter-layer dielectric layer between the first transfer transistor and the photodiode, the trench exposing the edge of the photodiode;

forming the dielectric layer on the first electrode and on a surface of the trench; and forming the second electrode on the dielectric layer.

* * * * *